United States Patent [19]

Kanetaki et al.

[11] Patent Number: 4,906,590
[45] Date of Patent: Mar. 6, 1990

[54] METHOD OF FORMING A TRENCH CAPACITOR ON A SEMICONDUCTOR SUBSTRATE

[75] Inventors: Yukimichi Kanetaki; Yasuo Kinoshita, both of Itami, Japan

[73] Assignee: Mitsubishi Denki Kabushiki Kaisha, Tokyo, Japan

[21] Appl. No.: 342,070

[22] Filed: Apr. 24, 1989

[30] Foreign Application Priority Data

May 9, 1988 [JP] Japan .................................. 63-112941

[51] Int. Cl.$^4$ .................... H01L 21/265; H01L 27/10
[52] U.S. Cl. .......................................... 437/52; 437/47; 437/60; 437/203; 437/229; 437/249; 357/23.6
[58] Field of Search ...................... 437/203, 47, 60, 52, 437/249, 229; 357/23.6, 55; 156/644

[56] References Cited

U.S. PATENT DOCUMENTS 4,397,075 8/1983 Fatula, Jr. et al. .................... 437/60
4,702,795 10/1987 Douglas ............................. 156/643

FOREIGN PATENT DOCUMENTS 173871 9/1985 Japan .
2168195 6/1986 United Kingdom ............... 357/23.6

OTHER PUBLICATIONS

Nicky C. C. Ju, "Advanced Cell Structures for Dynamic Rams", IEEE Circuits and Devices; vol. 5, No. 1, Jan. 1989, pp. 27-36.
F. H. Dill et al., "Modeling Projection Printing of Positive Photoresists", IEEE Transations of Electron Devices, vol. ED-22, No. 7, Jul. 1975, pp. 456-464.

Primary Examiner—Brian E. Hearn
Assistant Examiner—T. Thomas
Attorney, Agent, or Firm—Lowe, Price, Leblanc, Becker & Shur

[57] ABSTRACT

The disclosed method of forming a capacitor on a semiconductor substrate includes the steps of filling a trench in the semiconductor substrate with a photoresist, a step of exposing the photoresist in situ to a standing wave of light intensity which is created by interference between incident light directed to the bottom of the trench and reflected light from the bottom of the trench, developing and exposed photoresist in situ to leave periodic photoresist regions along the side wall of the trench in the direction of its depth, and etching the side wall using the residual periodic photoresist as a mask to create periodic hollows along the side wall of the trench.

7 Claims, 7 Drawing Sheets

METHOD OF FORMING A TRENCH CAPACITOR ON A SEMICONDUCTOR SUBSTRATE

BACKGROUND OF THE INVENTION

1. Field of the Invention

This invention relates to a method of manufacturing a semiconductor device and more particularly to a method of forming a capacitor.

1. Description of the Prior Art

In a typical dynamic memory device available today, each memory cell comprises one storage capacitor and one insulated gate field effect transistor (MOSFET). This capacitor stores information in the form of electric charges, while the transistor functions as a transfer gate between the capacitor and a bit line. To surely determine whether the capacitor is holding electric charges and reduce the soft error rate, the capacitance C of the capacitor is preferably as large as possible. The capacitance of a capacitor is expressed as $C = \epsilon s/t$, where $\epsilon$ is the dielectric constant of the insulation layer, s is the capacitor electrode area, and t is the thickness of the insulation layer.

On the other hand, for a high integration of the memory device, it is desirable to reduce the planar area which the capacitor occupies on a semiconductor chip. For assuring a sufficient value of capacitance C with a decreased capacitor electrode area s, it might be contemplated to reduce the thickness t of the insulation layer. However, the requirement of reliable insulation naturally imposes a limitation on the thickness of the insulation layer.

Therefore, in order to provide a sufficient effective electrode area s with a decreased planar area, a trench type capacitor has been proposed. However, in view of the prolonged etching time required and in consideration of the durability of the etching mask, the depth of the trench is also subject to a certain limitation. Therefore, a trench capacitor having a plurality of hollows in the side wall of the trench and a method of manufacturing it has recently been described in Japanese Patent Laying-Open Gazette No. 173871/1985.

FIG. 4 is a vertical sectional view of the memory cell disclosed in this Japanese Patent Laying-Open Gazette No. 173871/1985. As shown, one transistor and one capacitor are formed in a region surrounded by an isolating oxide layer 2 on a P-type silicon substrate 1. The capacitor comprises a silicon oxide insulation film 4 and a polysilicon capacitor electrode 6. The transistor comprises an N-type source region 8a, an N-type drain region 8b, a polysilicon gate electrode 7a and a silicon oxide gate insulation film 5. The drain 8b is connected to a bit line (not shown) and the gate electrode 7a is connected to a word line 7b of, for example, aluminum through a contact hole opened in an insulation layer 9. Moreover, the capacitor includes a trench region and the side wall of this trench has a plurality of hollows 10. Therefore, this capacitor occupies only a small planar area on substrate 1 and yet has a large effective electrode area.

FIGS. 5A through 5L schematically illustrate the steps for creating such a capacitor.

Referring to FIG. 5A, a thick isolating oxide layer 2 is formed on a P-type silicon substrate by the conventional selective oxidation method. Thereafter, the surface of substrate 1 is covered with a silicon oxide film 3 formed by the thermal oxidation. Provided through the silicon oxide layer 3 by photoetching is an opening, through which a trench 11 is created into substrate 1 by anisotropic etching. This anisotropic etching may for example be reactive ion etching with $CCl_4$ gas.

Referring, now, to FIG. 5B, an oxide film 4 is formed on the internal surface of said trench 11.

Referring to FIG. 5C, the oxide film 4 on the bottom surface of trench 11 is removed by anisotropic etching. This anisotropic etching may for example be reactive ion etching with $CF_4 + H_2$ gas.

Then, as illustrated in FIG. 5D, the bottom of trench 11 after removal of oxide film 4 is expanded by isotropic etching to form a lateral hollow or cavity 10. This isotropic etching may for example be plasma etching with $CF_4 + O_2$ gas.

Referring to FIG. 5E, the expanded bottom of trench 11 is covered with an oxide film 4.

Referring, now, to FIG. 5F, the trench 11 is deepened by anisotropic etching of its bottom.

Then, as illustrated in FIG. 5G, the internal surface of the new extension of trench 11 is covered with an oxide film 4.

Referring to FIG. 5H, the oxide film on the bottom of trench 11 is removed by anisotropic etching.

Referring to FIG. 5I, the bottom of trench 11 after removal of oxide film 4 is expanded by isotropic etching to form a second lateral hollow 10.

Then, as illustrated in FIG. 5J, the expanded bottom of trench 11 is covered with an oxide film 4.

The above sequence is repeated to form a third hollow 10 as illustrated in FIG. 5K.

Finally, the oxide film mask 3 is removed and the bottom of trench 11 and the top of substrate 1 are respectively covered with an oxide film 4. The above procedure gives a finished trench 11 having a plurality of hollows 10 along its side wall and having been covered with oxide film 4 as illustrated in FIG. 5L. Thereafter, the conventional procedure is followed to fabricate a memory cell having a trench type capacitor as shown in FIG. 4.

SUMMARY OF THE INVENTION

The above prior art method for creating a trench type capacitor having a plurality of hollows along the side wall of the trench requires a very high complicated multiple-stage process and, hence, a very high production cost. This invention has been accomplished to overcome the above-mentioned drawbacks of the prior art technology.

It is, therefore, an object of this invention to provide a production method by which a trench type capacitor having a plurality of hollows along the side wall of the trench can be created easily and at low cost.

A method of forming a capacitor on a semiconductor substrate in accordance with this invention comprises the steps of forming a mask layer having an opening on a major surface of the substrate, forming a trench having a bottom wall and a side wall within the substrate by anisotropic etching through the opening, filling the trench with a photoresist, exposing the photoresist layer in the trench to a standing wave of light intensity which is created by the interference between incident light directed to the bottom of the trench and reflected light from the bottom of the trench, developing the photoresist exposed to the standing wave of light intensity to leave periodic regions of photoresist along the side wall of the trench in the direction of its depth, etching the side wall of the trench using the residual periodic photoresist as a mask to create periodic hollows along the side wall of the trench, removing the residual periodic photoresist and forming an insulation layer on the side wall and bottom wall of the trench, and forming a conductive layer on the insulation layer formed on the side wall and bottom wall of the trench.

Since the method of this invention includes the steps of filling the trench with a photoresist, exposing this photoresist in situ to a standing wave of light intensity created by the interference between incident light directed to the bottom of the trench and reflected light from the bottom and developing the exposed photoresist in situ to leave periodic regions of photoresist along the side wall of the trench in the direction of its depth, periodic hollows can be easily created along the side wall of the trench by etching the side wall utilizing the residual periodic photoresist as a mask.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

The exposure effect of the standing wave of light intensity created by the interference between light incident on a photoresist layer and light reflected from the bottom of the photoresist layer has been investigated by F. H. Dill et al. in IEEE Transactions on Electron Devices, Vol. ED-22, 1975, pp. 456-464.

Figure 3A:
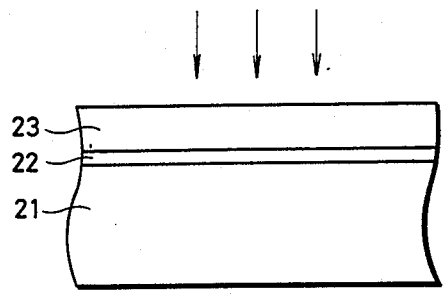
FIG. 3A is a sectional elevation view showing the step of exposing the photoresist layer to light.

Referring to FIG. 3A, a silicon substrate 21 carries on one side thereof a 60 nm-thick $SiO_2$ layer 22 which, in turn, has an AZ-1350J positive resist (Shipley Company Inc.) layer 23 coated in the thickness of 584 nm.

Figure 3B:
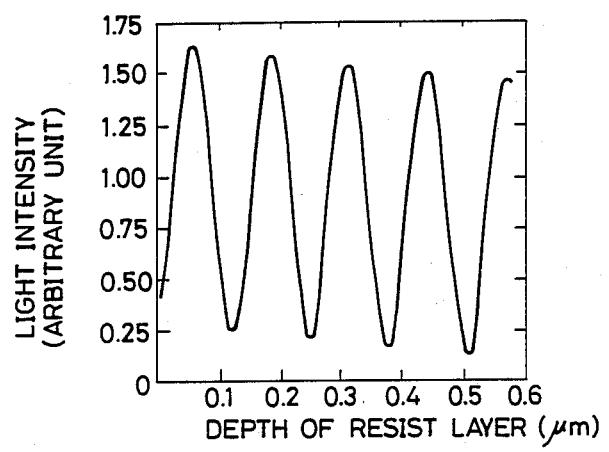
FIG. 3B is a diagrammatic view showing the standing wave of light intensity created in the photoresist layer.
Figure 3C:
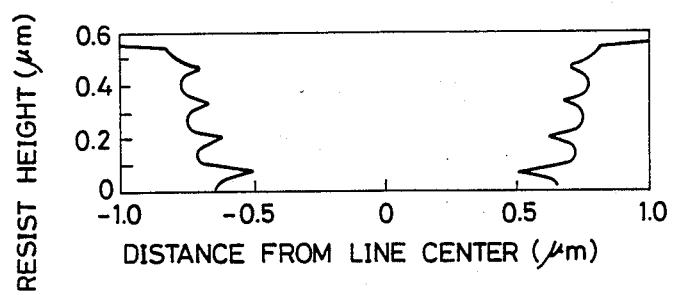
FIG. 3C is a diagrammatic view showing the effect of exposure due to the standing wave of light intensity within the photoresist layer.

Incidence of light at a wavelength of 435.8 nm on the photoresist layer 23, as indicated by arrowmarks in FIG. 3A, induces interference between the incident light and the reflected light from the bottom of the photoresist layer, resulting in the formation of a standing wave of light intensity in the depth direction of the photoresist layer 23 as shown in FIG. 3B. When the photoresist layer 23 exposed linearly to a light beam having a nominal breadth of 1 μm is developed with a 1:1 mixture of AZ developer and water at 20° C. for 85 seconds, the configuration of residual photoresist across the section perpendicular to the line of exposure has periodic recesses (hollows) in the thickness direction of the photoresist layer as illustrated in FIG. 3C.

FIGS. 1A through 1D schematically illustrate the steps of forming a capacitor according to an embodiment of this invention.

Figure 1A:
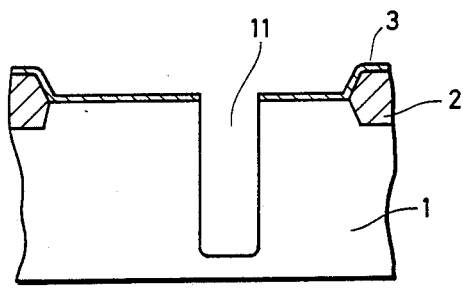
FIGS. 1A through 1D each is a schematic sectional elevation view illustrating a method of forming a capacitor as an embodiment of this invention.

Referring to FIG. 1A, a thick isolating oxide layer 2 is formed on a silicon substrate 1 by the conventional selective oxidation method. Then, the surface of the substrate is covered with a silicon oxide layer 3 formed by thermal oxidation. Formed through the silicon oxide layer 3 by photoetching is an opening, through which a trench 11 is created in the substrate 1 by anisotropic etching. This anisotropic etching may for example be reactive ion etching with $CCl_4$ gas.

Figure 1B:
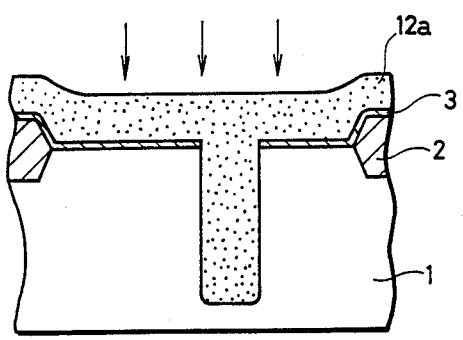

Referring, now, to FIG. 1B, the trench 11 is filled up with a photoresist 12a. Then, the trench 11 is irradiated with light as indicated by arrowmarks, whereupon the photoresist layer 12a in trench 11 is exposed to the standing wave of light intensity created by interference with the incident light and the reflected light from the bottom of the trench.

Figure 1C:
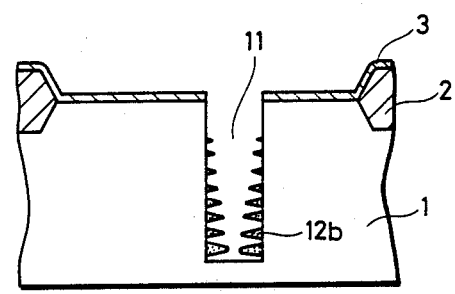

Referring to FIG. 1C, development of the exposed photoresist 12a results in periodic residues 12b of photoresist along the side wall of trench 11. In other words, by appropriate control over development time, for instance, the side wall of trench 11 can be exposed in a periodic fashion with the photoresist portions 12b. By dry etching of the side wall of trench 11 in this condition using, for example, $CF_4+O_2$ gas, a plurality of hollows can be created in a periodic pattern along the side wall of trench 11.

Figure 1D:
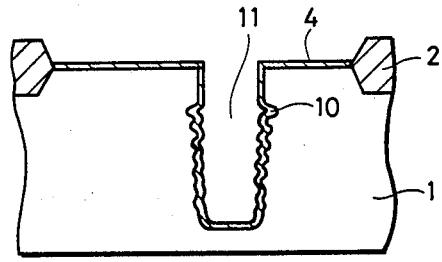

Finally, the residual photoresist 12b is removed by means of, for example, a plasma asher and the oxide mask layer 3 is also removed. Then, the internal surface of trench 11 and the top of substrate 1 are covered with an oxide film 4. The above procedure gives a finished trench 11 having a plurality of hollows 10 and having been covered with oxide 4 as illustrated in FIG. 1D.

Figure 2:
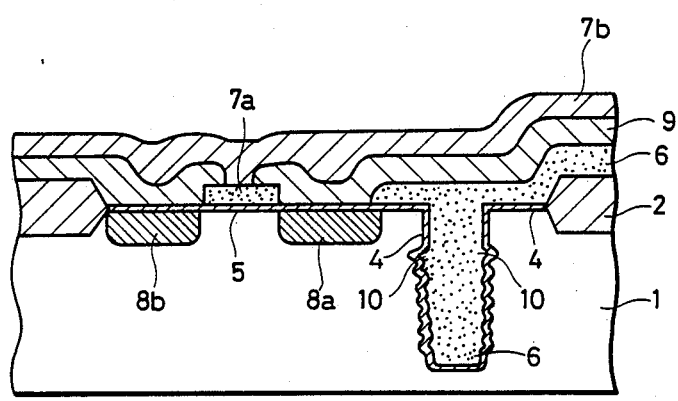
FIG. 2 is a sectional elevation view showing a memory cell having a capacitor formed by a method of this invention.
Figure 4:
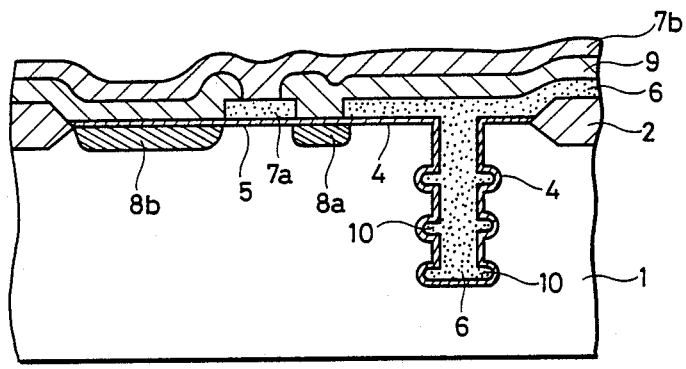
FIG. 4 is a sectional elevation view showing a memory cell fabricated by a prior art method.
Figure 5A:
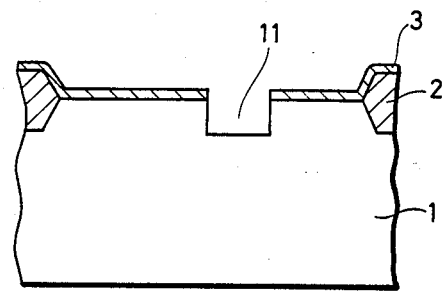
FIG. 5A through 5L are sectional views showing a prior art method of forming a trench type capacitor.
Figure 5B:
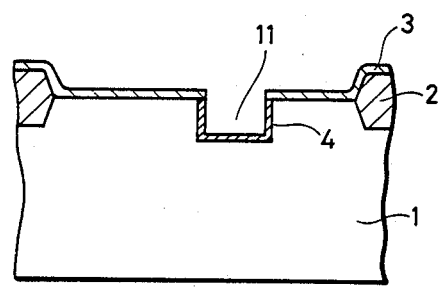
Figure 5C:
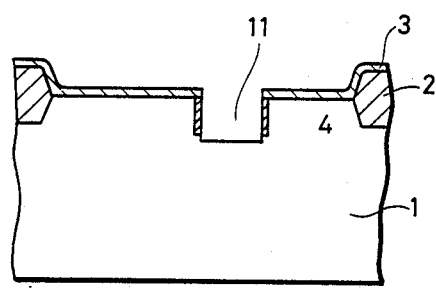
Figure 5D:
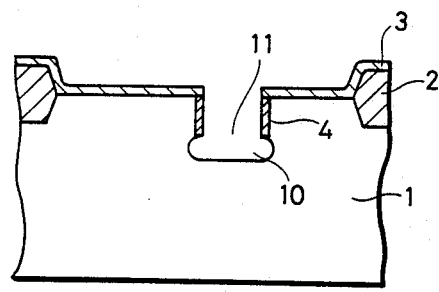
Figure 5E:
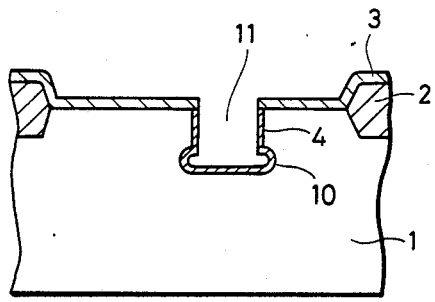
Figure 5F:
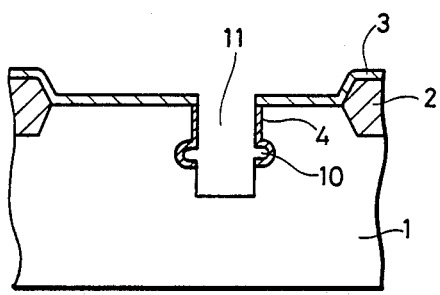
Figure 5G:
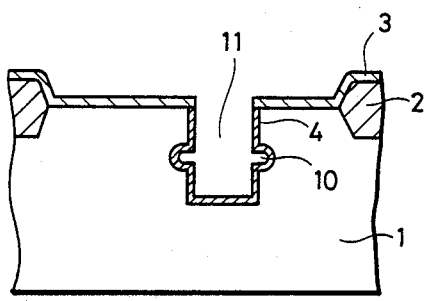
Figure 5H:
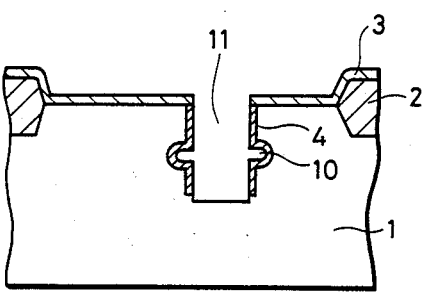
Figure 5I:
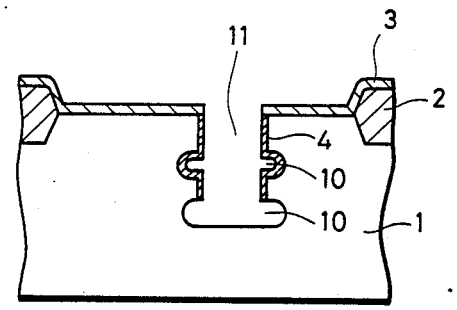
Figure 5J:
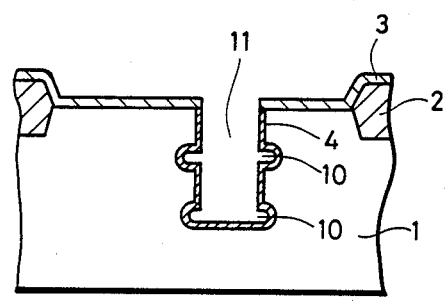
Figure 5K:
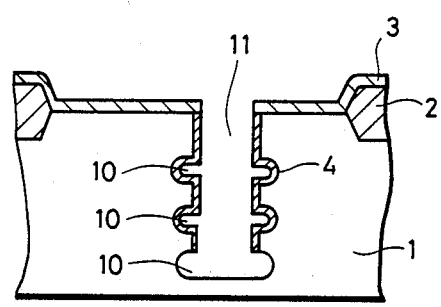
Figure 5L:
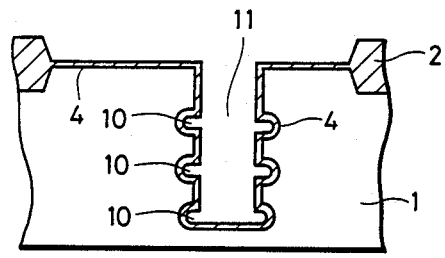

Thereafter, a memory cell having a trench type capacitor as shown in FIG. 2 can be fabricated by the conventional process. Except that the capacitor has been formed by the method of this invention, the memory cell shown in FIG. 2 is similar to the memory cell illustrated in FIG. 4.

Thus, because the method of this invention includes the steps of filling a trench with a photoresist, exposing the photoresist in situ to a standing wave of light intensity created by interference between the incident light and the reflected light from the bottom of the trench and developing the exposed photoresist in situ to leave photoresist portions in a periodic fashion along the side wall of the trench in the direction of its depth, periodic hollows can be easily created along the side wall of the trench by etching the side wall utilizing the residual periodic photoresist as a mask.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a capacitor on a semiconductor substrate, comprising the steps of:
   forming a mask layer having an opening on a major surface of said substrate,
   forming a trench having a bottom wall and a side wall in said substrate by anisotropic etching through said opening,
   filling said trench with a photoresist, exposing the photoresist in the trench to a standing wave of light intensity which is created by interference between incident light directed to the bottom of the trench and reflected light from the bottom of the trench, developing the photoresist exposed to said standing wave of light intensity to leave periodic regions of photoresist along the side wall of the trench in the direction of its depth, etching the side wall of the trench using the residual periodic photoresist as a mask to create periodic hollows along the side wall of the trench, removing the residual periodic photoresist and forming an insulation layer on the side wall and bottom wall of the trench, and forming a conductive layer on the insulation layer formed on the side wall and bottom wall of the trench.

2. The method of claim 1 wherein said semiconductor substrate is a silicon substrate.

3. The method of claim 2 wherein said mask layer having the opening is a silicon oxide layer created by thermal oxidation and said opening is created by photo-etching.

4. The method of claim 3 wherein said anisotropic etching is reactive ion etching with $CCl_4$ gas.

5. The method of claim 1 wherein said photoresist is a positive-acting photoresist.

6. The method of claim 1 wherein the periodic hollows along the side wall of the trench are created by dry etching with $CF_4+O_2$ gas.

7. The method of claim 1 wherein said residual periodic photoresist is removed by means of a plasma asher.

* * * * *